(12) United States Patent
Hwang et al.

(10) Patent No.: US 7,069,641 B2
(45) Date of Patent: Jul. 4, 2006

(54) METHOD FOR PREPARING COMPOSITE MATERIALS OF A POSITIVE TEMPERATURE COEFFICIENT THERMISTOR

(75) Inventors: Ren-Haur Hwang, Taoyuan (TW); Der-Yang Liu, Taoyuan (TW); Chen-Ron Lin, Hsinchu (TW)

(73) Assignee: Protectronics Technology Corporation, Taoyuan (TW)

( * ) Notice: Subject to any disclaimer, the term of this patent is extended or adjusted under 35 U.S.C. 154(b) by 301 days.

(21) Appl. No.: 10/424,144

(22) Filed: Apr. 25, 2003

(65) Prior Publication Data

US 2003/0217457 A1 Nov. 27, 2003

Related U.S. Application Data

(62) Division of application No. 10/056,459, filed on Jan. 24, 2002, now Pat. No. 6,590,491.

(30) Foreign Application Priority Data

Mar. 7, 2001 (TW) ............................. 90105217 A

(51) Int. Cl.
*H01C 17/00* (2006.01)
(52) U.S. Cl. ............ 29/610.1; 29/610.1; 29/611; 29/612; 29/613; 29/615; 29/619; 29/621; 205/164; 205/191; 205/255; 257/741; 257/762; 338/22 R; 338/22 SD; 338/312; 338/313
(58) Field of Classification Search ............ 29/610.1, 29/611–613, 615, 619, 621; 257/741, 762; 338/22 R, 22 SD, 312, 313; 205/164, 191, 205/255
See application file for complete search history.

(56) References Cited

U.S. PATENT DOCUMENTS

| | | | |
|---|---|---|---|
| 4,314,230 A | 2/1982 | Cardinal et al. | 338/314 |
| 4,689,475 A | 8/1987 | Kleiner et al. | 219/553 |
| 4,800,253 A | 1/1989 | Kleiner et al. | 219/553 |
| 4,833,305 A | 5/1989 | Mashimo et al. | 219/549 |
| 5,068,061 A | 11/1991 | Knobel et al. | 338/314 |
| 5,247,276 A | 9/1993 | Yamazaki | 338/22 R |
| 5,518,840 A | 5/1996 | Verhoog et al. | 429/211 |
| 5,874,855 A | 2/1999 | Azuma et al. | 327/589 |
| 5,955,936 A | 9/1999 | Shaw, Jr. et al. | 388/22 R |
| 6,277,510 B1* | 8/2001 | Chang et al. | 429/30 |
| 6,603,205 B1* | 8/2003 | Miura | 257/762 |
| 6,640,420 B1* | 11/2003 | Hetherton et al. | 29/612 |

* cited by examiner

*Primary Examiner*—A. Dexter Tugbang
*Assistant Examiner*—Tim Phan
(74) *Attorney, Agent, or Firm*—Ladas & Parry LLP

(57) ABSTRACT

The present invention discloses a method for preparing a conductive polymeric composite material having carbon black utilized to a structure for composite materials of a positive temperature coefficient thermistor. The method first provides a metal laminated material comprising a top metal layer and a bottom metal layer, an insulating layer between the top and the bottom metal layer, and a conducting through hole disposed between the top metal layer and the bottom metal layer. A composite electroplating process is then performed to form an composite electroplating layer on the surface of the top metal layer, wherein the composite electroplating layer is a continuous porous structure with a secondary aggregation of carbon black and electroplated metal. Finally, a thermal-laminating process is performed to laminate a polymeric composite material on the composite electroplating layer to form the composite materials of the positive temperature coefficient thermistor device, wherein the polymeric composite material is conductive crystallized and filled with the carbon black.

9 Claims, 7 Drawing Sheets

METHOD FOR PREPARING COMPOSITE MATERIALS OF A POSITIVE TEMPERATURE COEFFICIENT THERMISTOR

CROSS-REFERENCE TO RELATED APPLICATIONS

The is a division of application Ser. No. 10/056,459, filed on Jan. 24, 2002, now U.S. Pat. No. 6,590,491, the disclosure of which is incorporated herein by reference.

BACKGROUND OF THE INVENTION

1. Field of the Invention

The present invention relates to a method for preparing composite materials of a positive temperature coefficient thermistor, and more particularly, to a method for preparing a conductive polymeric composite material having carbon black utilized to a structure for composite materials of a positive temperature coefficient thermistor.

2. Description of Related Art

Thermistor devices are already widely used in many fields, such as temperature detection, security control, temperature compensation, and so on. In the past, a thermistor device has mainly utilized ceramic material. However, ceramic material needs to be manufactured at high temperatures, in most cases, higher than 900° C. Thus the energy consumption is enormous, and the process is very complicated. Later on, a thermistor device utilizing a polymeric substrate is developed. Since the manufacturing temperature of a thermistor device utilizing a polymeric substrate can be lower than 300° C., the manufacturing process is easier, less energy is consumed, and production cost is lowered. Consequently, its application becomes more and more popular as time goes on.

The conductive crystallized polymeric composite material filled with carbon black is under a low resistance status at a room temperature due to its characteristics of the positive temperature coefficient thermistor. When a current flowing through the conductive crystallized polymeric composite material filled with carbon black is too large, and the temperature of the conductive crystallized polymeric composite material filled with carbon black reaches the melting point of polyethylene, volumes of resin in the conductive crystallized polymeric composite material filled with carbon black expand to an extent that makes the conductive stuffing materials in the conductive crystallized polymeric composite material filled with carbon black break down from a continuous status to a discontinuous status. Thus, the resistance of the conductive crystallized polymeric composite material filled with carbon black will rise rapidly, and plaques made of conductive crystallized polymeric composite material filled with carbon black will break the current accordingly. Therefore, plaques made of conductive crystallized polymeric composite material filled with carbon black can be applied to the multi-layer circuit laminated structure for an over-current protection device and a temperature switch device.

However, the interfacial adhesion strength of the plaques made of the metal foil and conductive crystallized polymeric composite material filled with carbon black is not good enough after the thermal laminating process. The adhesion of conductive crystallized polymeric composite material filled with carbon black and metal foil is achieved by a resin inside the conductive crystallized polymeric composite material filled with carbon black. Since the resin tends to flow as the temperature increases, carbon black will fill into the metal electrodes surface of metal laminated material and space between the conductive carbon particles of conductive polymeric composite material. However, the carbon black cannot fully contact with the metal electrodes of the metal laminated plaque, and thus increases the interfacial resistance between metal laminated plaque and the conductive crystallized polymeric composite material plaque filled with carbon black. Moreover, when a laminated structure of the multi-layer circuit is used to fabricate an over-current protection device or a temperature switch device, it has to face various kinds of regular or irregular temperature variation. This leads to problems of adhesions between the electrodes of the metal laminated plaque and the conductive crystallized polymeric composite material plaque filled with carbon black.

To solve the problems of adhesion strength and interfacial resistance, U.S. Pat. Nos. 4,689,475 and 4,800,253 utilize electroplating technique for forming a rough surface with metal nodular protrusions on the surface of metal foil to increase the adhesion strength of the metal electrodes and the conductive crystallized polymeric composite material laminate filled with carbon black.

However, the techniques disclosed by theses patents use carbon black to be directly wedged to metal nodular protrusions and the geometric shapes of carbon black and metal nodular protrusions are different, therefore the contact density is not very good. Meanwhile, mobility of resin on the surface of carbon black is not good between carbon black and metal, the resin can only be adhered to the surface of the metal and thus, increase the interfacial resistance and affect its function.

Furthermore, a known fabrication method of a thermistor is to make the conductive crystallized polymeric composite material filled with carbon black adhere to a foil, such as a copper foil or nickel foil. The method is subjected to the foil material to proceed with a continuous electroplating process for a whole roll of foil, so that the fabrication method is limited.

SUMMARY OF THE INVENTION

The object of the present invention is to provide a method for preparing a conductive polymeric composite material having carbon black utilized to a structure for composite materials of a positive temperature coefficient thermistor.

To achieve the objects described above and other effects, the present invention provides a method for preparing a conductive polymeric composite material having carbon black utilized to a structure for composite materials of a positive temperature coefficient thermistor. The method first provides a metal laminated material comprising a top metal layer and a bottom metal layer, an insulating layer between the top and the bottom metal layer, and a conducting through hole disposed between the top metal layer and the bottom metal layer. A composite electroplating process is then performed to form an composite electroplating layer on the surface of the top metal layer, wherein the composite electroplating layer is a continuous porous structure with a secondary aggregation of carbon black and electroplated metal. Finally, a thermal-laminating process is performed to laminate a polymeric composite material on the composite electroplating layer to form the composite materials of the positive temperature coefficient thermistor device, wherein the polymeric composite material is conductive crystallized and filled with the carbon black.

Because of the composite electroplating process, the surface of porous structure of the top metal layer already contains carbon black. When a thermal-laminating process is later performed, carbon black of the porous structure of the top metal layer can be tightly integrated with the conductive polymeric composite material having carbon black to form a strong adhesion.

Moreover, because the tight integration of carbon black of the porous structure of the top metal layer with the conductive polymeric composite material, the interfacial resistance between the metal electrodes and the conductive polymeric composite material is effectively lowered.

Furthermore, because there are already available printed circuit boards that can be used as the metal laminated material of the present invention, the well-developed printed circuit board process can be used directly in the process of the thermistor device. Manufacturing the thermistor device by means of the plaque fabrication method of the printed circuit board process is simpler than the continuous electroplating process for the whole roll of soft foil according to the prior art, and the process can be greatly simplified.

BRIEF DESCRIPTION OF THE DRAWINGS

The present invention is described below by way of examples with reference to the accompanying drawings which will make readers easily understand the purpose, technical contents, characteristics and achievement of the present invention, wherein.

PREFERRED EMBODIMENT OF THE PRESENT INVENTION

Figure 1:
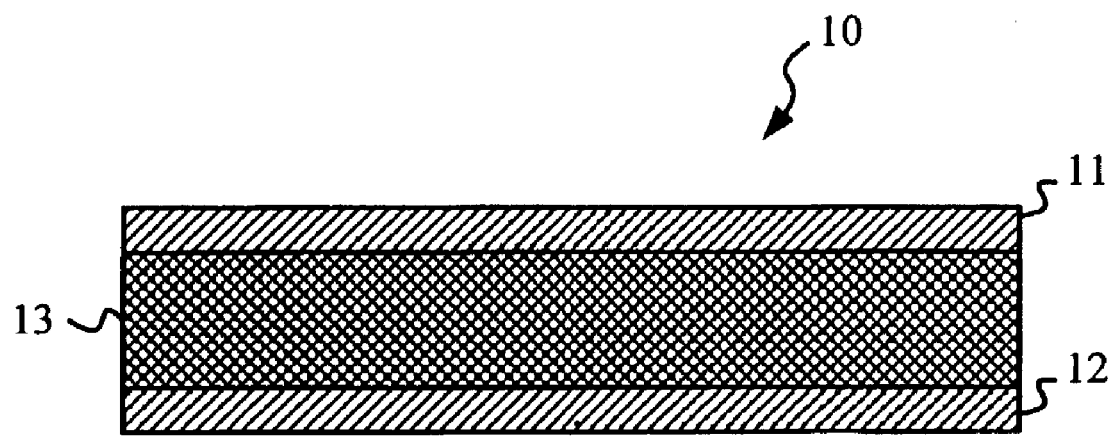
FIG. 1 is a cross-sectional view of a metal laminated material according to an embodiment of the present invention.

FIG. 1 is a cross-sectional view of a metal laminated material 10 according to the present invention. The metal laminated material 10 comprises a printed circuit board, a bottom metal layer 12 (a first electrode), a top metal layer 11 (a second electrode) and an insulating layer 13. The top metal layer 11 and the bottom metal layer 12 can be made of copper foil, nickel foil, platinum, copper alloy, nickel alloy, platinum alloy, or other conductive materials with a thickness of 18 m. The insulating layer 13 can be a laminated material layer made of an epoxy resin layer, a polyimide resin layer, a glass fiber cloth impregnated with the epoxy resin, or a laminated material layer made of glass fiber cloth impregnated with a polyimide.

Figure 2:
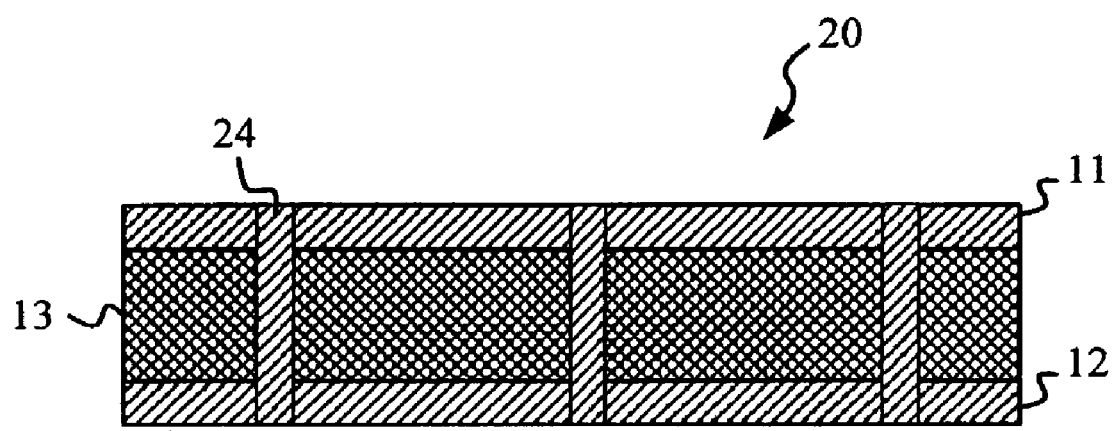
FIG. 2 is a cross-sectional view of the metal laminated material according to the present invention.

FIG. 2 is a cross-sectional view of the metal laminated material 20 according to the present invention. A printed circuit board process is performed to form a plurality of plate through holes 24 with a diameter of 0.05 cm and a pitch of 1 cm in a metal laminated material 10 with a size of 20 cm×20 cm. The plate through hole 24 electrically conducts the top metal layer 11 and the bottom metal layer 12 of the metal laminated material 20 to each other.

Figure 3:
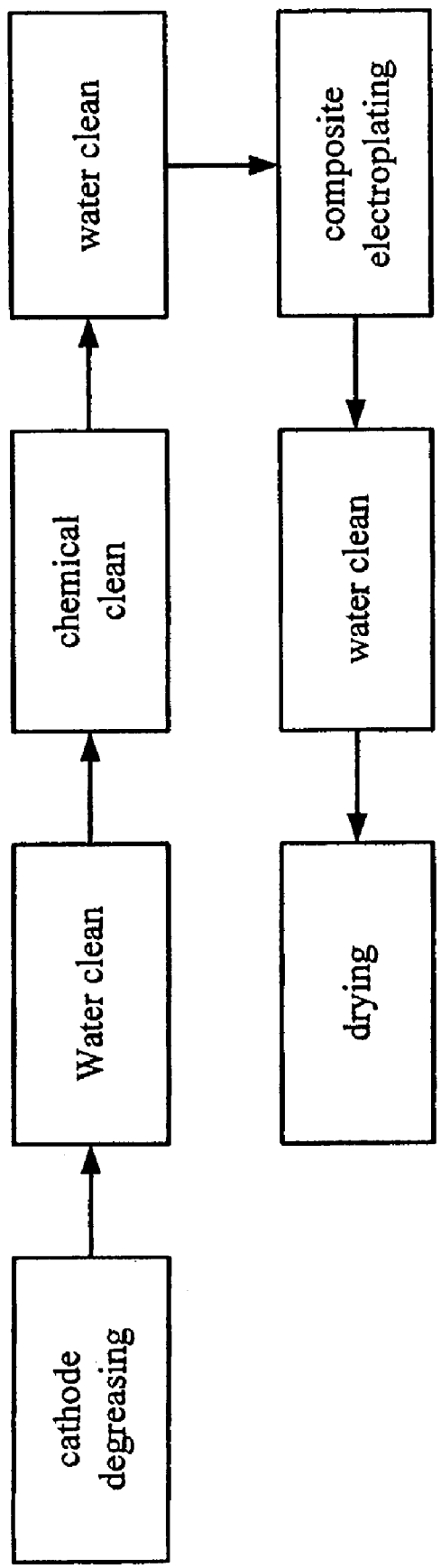
FIG. 3 is a flow chart of a composite electroplating process performed to the metal laminated material according to the present invention.

FIG. 3 is a flow chart of a composite electroplating process performed to the metal laminated material 20 according to the present invention. The metal laminated material 20 undergoes these processes to composite electroplate the top metal layer 11. 1 liter of electroplating solution includes 40 grams boric acid, 6 grams of carbon black XC-72 (a product of Cabot Co. of U.S.), and 30 grams of nickel (weight of nickel in a nickel sulphamate solution). The electroplating process is performed at approximately 35° C., with a current density 3 A/dm2, for approximately 10 minutes. The degreasing solvent used in the cathode degreasing step is prepared by adding 60 grams of degreasing agent to 1 liter of deionized water, and the concentration of sulfuric acid used for acid rinse is 10%.

Figure 4:
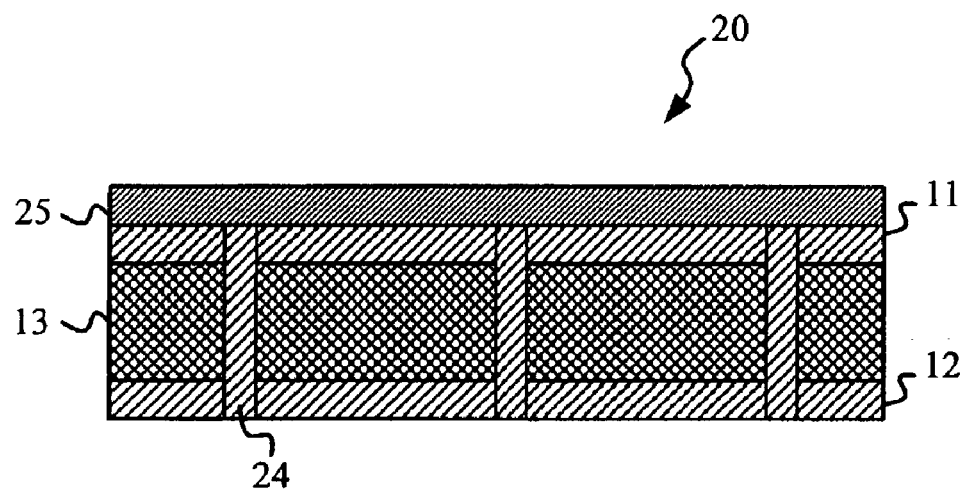
FIG. 4 is a cross-sectional view of the metal laminated material after the composite electroplating process is performed according to the present invention.
Figure 5:
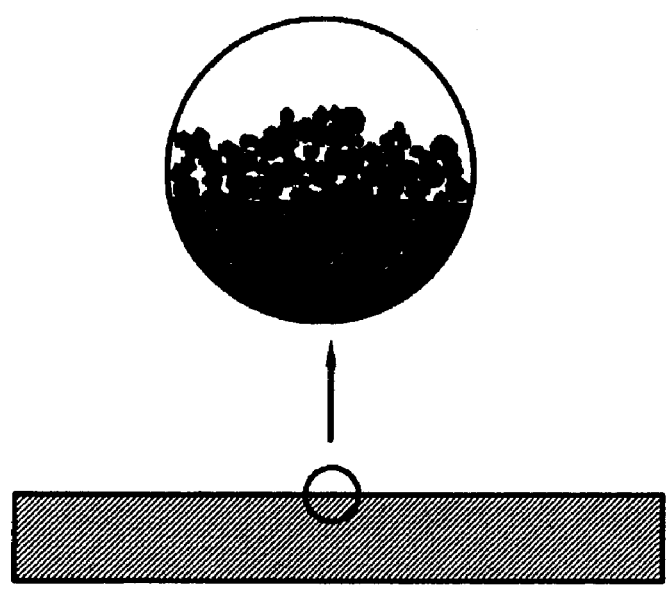
FIG. 5 is an enlarged diagram of a porous structure on the surface of the electroplated metal according to the present invention.

FIG. 4 is a cross-sectional view of the metal laminated material 20 after the composite electroplating process is performed according to the present invention. The composite electroplating process forms a continuous porous metallic composite electroplating layer 25 having a carbon black and a metal (as shown in FIG. 5) on the surface of the top metal layer 11 of the metal laminated material 20. The metallic composite electroplating layer 25 comprises an electroplated metal, a primary and a secondary aggregation of carbon black, and the electroplated metal adheres to the surface of the primary aggregation and the secondary aggregation of the carbon black to form a porous structure. In this preferred embodiment, the thickness of the metallic composite electroplating layer 25 after the composite electroplating process is preferably between 17 μm and 25 μm.

Figure 6:
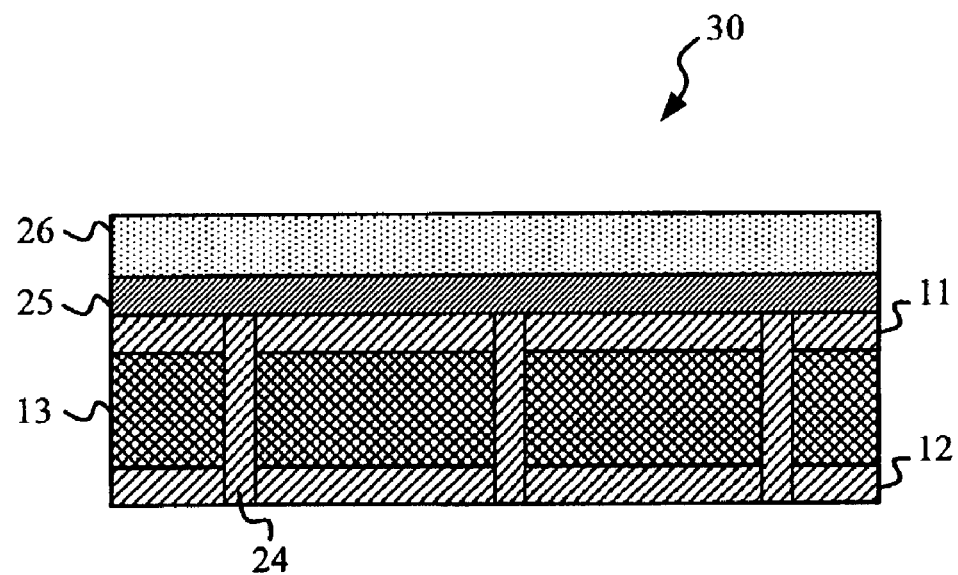
FIG. 6 is a cross-sectional view of a conductive composite material according to the present invention.

FIG. 6 is a cross-sectional view of a conductive composite material 30 according to the present invention. The metal laminated material 20 is thermal-laminated with a polymeric composite material 26 to form the conductive composite material 30. The polymeric composite material 26 is conductive crystallized and filled with carbon black. Polyethylene, polypropylene, polyvinyl fluoride, or copolymers thereof can be used to made of the polymeric composite material 26. In this preferred embodiment, the polymeric composite material 26 is made of mixing polyethylene Petrothene LB832 (a product of Equistar Co. of U.S.) and carbon black Raven 450 (a product of Columbian Co. of U.S.) at a weight ratio of 1:1 together, and then was incorporated into the Brabender mixer and mixed at 210° C. for 8 minutes. It was then thermal-laminated at approximately 175° C. with the metal laminated material 20 to form the plaque-shaped conductive composite material 30 having PTC characteristics with the thickness of 1 mm.

Figure 9:
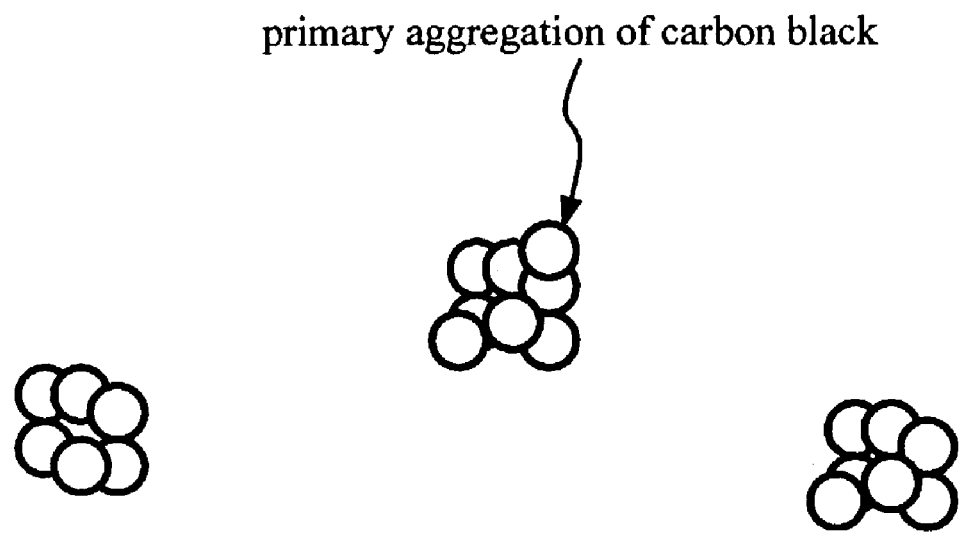
FIG. 9 is a diagram showing the primary aggregation of carbon black according to the present invention.
Figure 10:
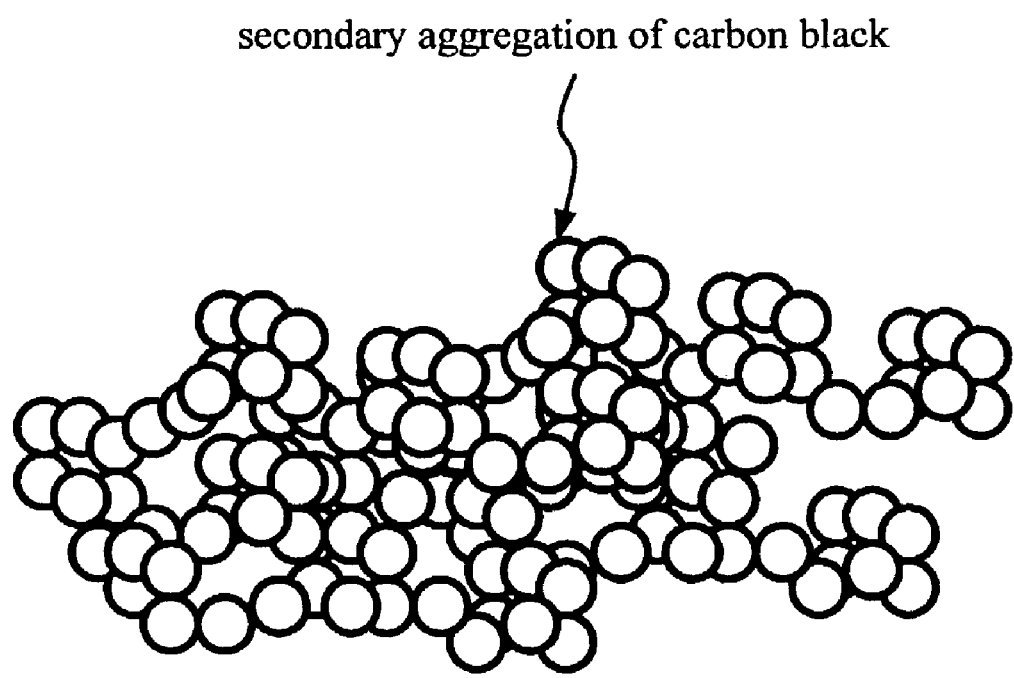
FIG. 10 is a diagram showing the secondary aggregation of carbon black according to the present invention.
Figure 11:
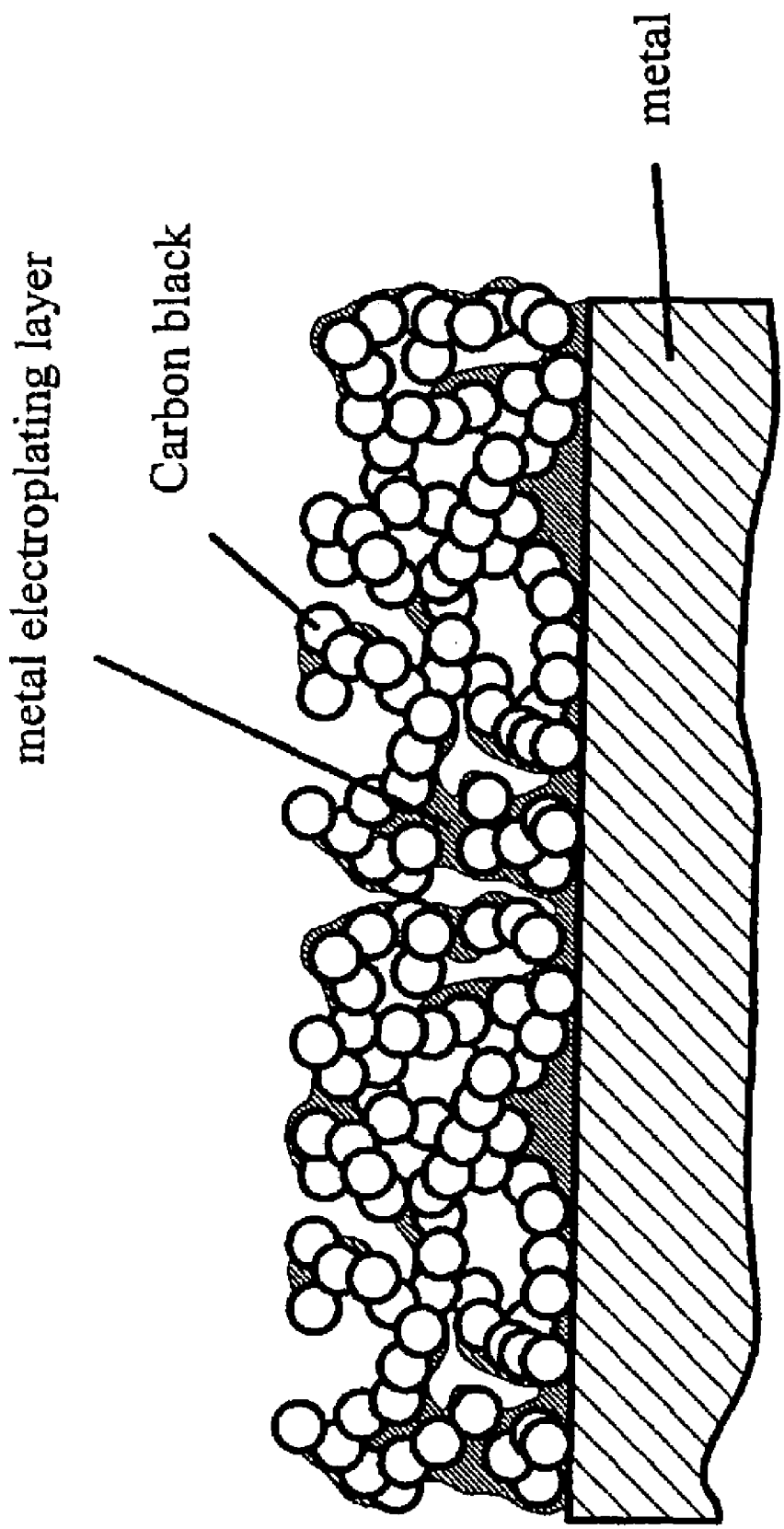
FIG. 11 is a cross-sectional view of the composite electroplating layer of a continuous porous carbon black with a metal according to the present invention.

Since the composite electroplating process electroplates the carbon black on the surface of the metal layer 11 of the metal laminated material 20 to form metallic composite electroplating layer 25 with a continuous porous structure, there are carbon black on the surface of the top metal layer 11 and in the polymeric composite material 26 filled with carbon black. Carbon black in the metallic composite electroplating layer 25 with a continuous porous structure and the polymeric composite material 26 filled with carbon black is in a basic form of primary aggregation (as shown in FIG. 9) and stack on each other in the resin substrate. When the quantity of carbon black is large, the primary aggregation of the carbon black will stack on each other to form secondary aggregation (as shown in FIG. 10) and become a conductive continuous phase in the composite material. The metallic composite electroplating layer 25 with a continuous porous structure is constituted by metal, the primary aggregation of carbon black, and the secondary aggregation of carbon black. Because of the composite electroplating process, metal adheres to the surface of the secondary aggregation of the carbon black as shown in FIG. 11. Moreover, the metallic composite electroplating layer 25 with a continuous porous structure further forms the secondary aggregation with the polymeric composite material 26 that is conductive crystallized and filled with the carbon black. The size of the primary aggregation of carbon black varies with different kinds of carbon black, and the average size is preferably between 0.1 μm and 0.5 μm.

From micro-phenomenon observation, the continuous porous structure of the metallic composite electroplating layer 25 on the surface of the top metal layer 11 is quite similar to the microstructure of the carbon black conductive continuous phase in the polymeric composite material 26. Therefore, the continuous porous structure of the metallic composite electroplating layer 25 and the carbon black conductive continuous phase of the polymeric composite material 26 filled with carbon black form a strong adhesion. Furthermore, during the thermal laminating process, heat will force the resin adhered to the carbon black in the polymeric composite material 26 to flow and permeate into the continuous porous structure of the metallic composite electroplating layer 25 on the surface of the top metal layer 11. Therefore, resin does not influence route for carbon black to conduct electricity in the polymeric composite material 26 filled with carbon black and directly contact to the top metal layer 11. To make sure that conductive composite material of polyethylene forms a good adhesion strength with the top metal layer 11, the thickness of the metallic composite electroplating layer 25 is preferably more than twice the average diameter of the primary aggregation of carbon black. That is to say, the thickness of the metallic composite electroplating layer 25 with continuous porous structure layer is preferably more than 0.2 μm.

Figure 7:
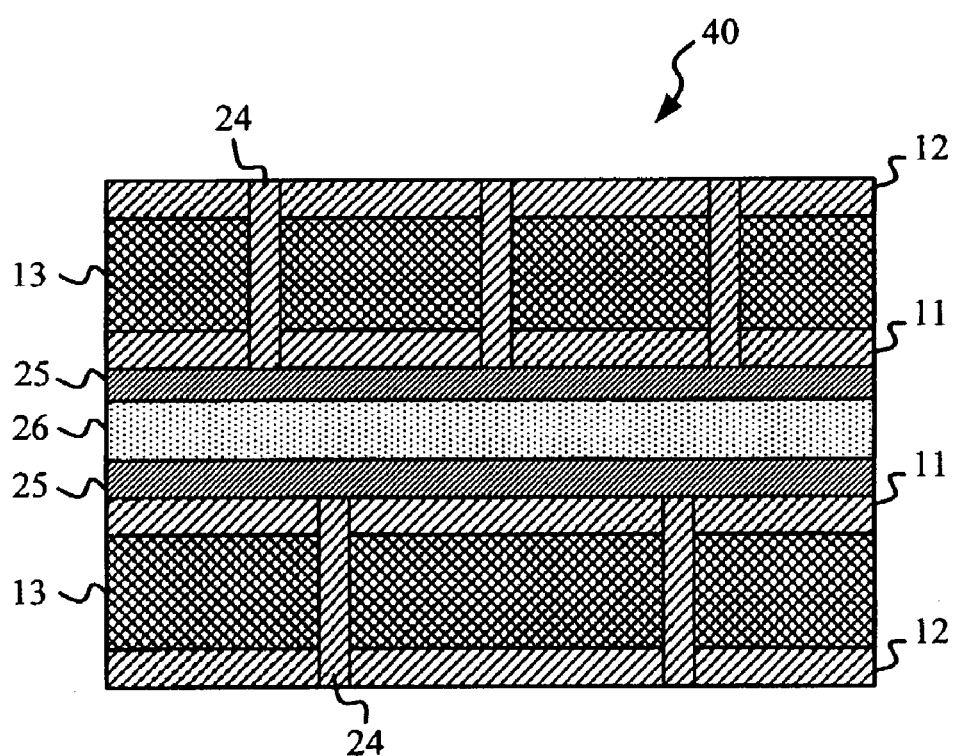
FIG. 7 is a cross-sectional view of an electrical characteristic testing sample of the positive temperature coefficient thermistor produced according to the present invention.

FIG. 7 is a cross-sectional view of an electrical characteristic testing sample of the positive temperature coefficient thermistor produced according to the present invention. Two plaque-shaped conductive composite materials 30 facing each other with polymeric composite material 26 filled with carbon black are laminated by thermal laminating at 175° C. for 10 minutes to form an electricity tested sample of a positive temperature coefficient thermistor device 40. The sample is then cut into specimens with a size of 2 cm×2 cm and using Co-60 with a dosage of 20 Mrad performs an irradiating process.

Figure 8:
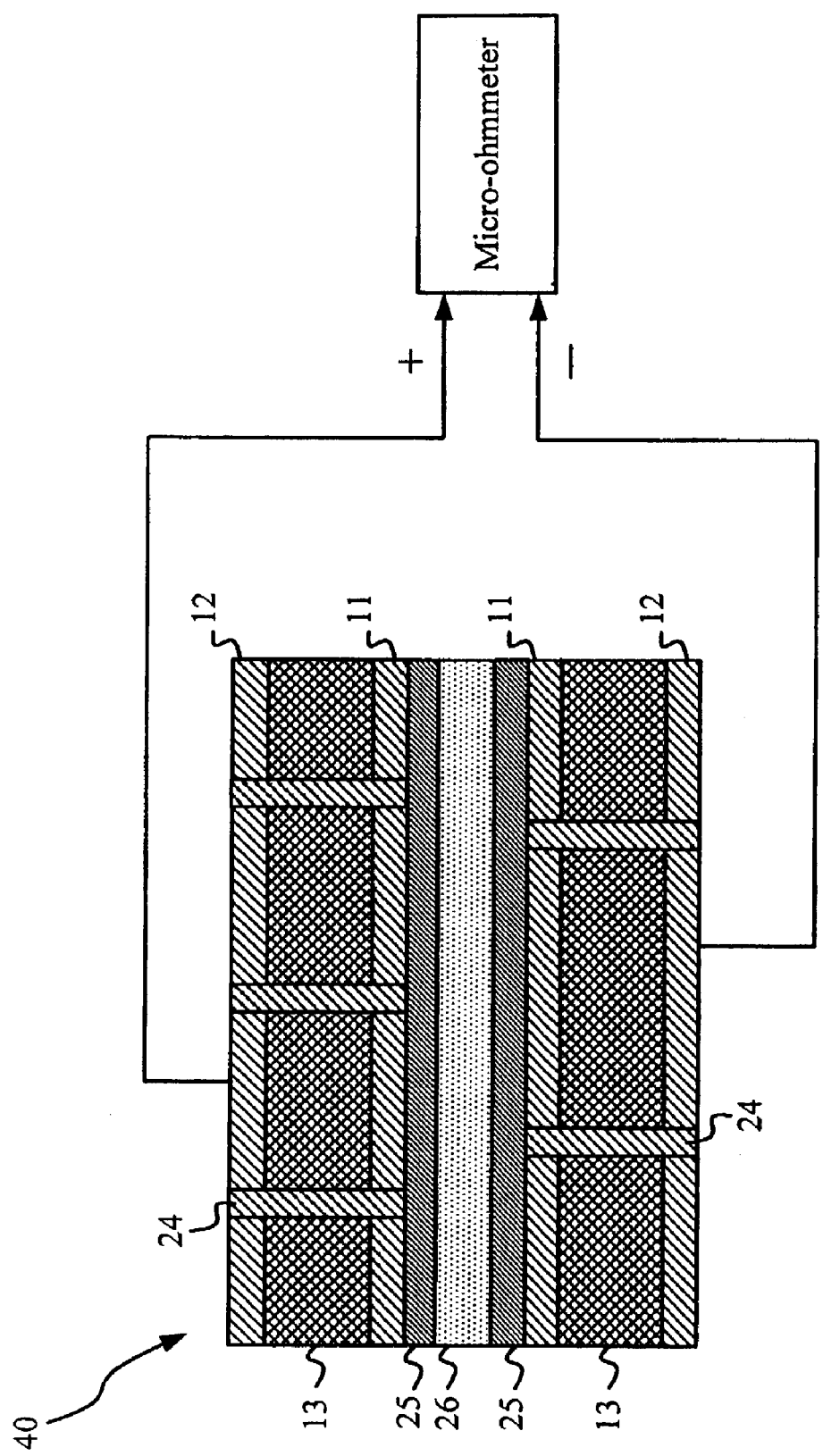
FIG. 8 is a diagram showing a resistance testing according to the present invention.

FIG. 8 is a schematic diagram showing a resistance testing according to the present invention. The resistance testing is conducted with a microohmmeter. A resistance sample R1 and a resistance sample R2 are measured for observing the room temperature resistance variation. The sample resistance R2 was soaked in melted tin at 230° C. for 3 seconds, and then placed at the normal atmosphere temperature for 1 hour. From the comparison of R1 and R2, we can prove there is a fine adhesion between the metal plate laminated material 20 processed with carbon black composite electroplating and the polymeric composite material 26 filled with carbon black, and the interfacial resistance is smaller.

The prescriptions and the experimental conditions of the electroplated solution of the embodiment of the present invention, other embodiments, and the comparison embodiment are presented in table 1, and the thickness of the composite electroplated layers of the embodiments and the comparison embodiments after composite electroplating treatment are presented in table 2. The weights of each ingredient shown in table 1 represent the amount of ingredient added into 1 liter of electroplated solution. Weights of Nickel represent weights of Ni metal in Nickel Sulphamate solution. R1 in table 2 is the room temperature resistance of a sample that is thermal-laminated with conductive crystallized polymeric composite material filled with carbon black without soaking in melted tin at 230° C. afterward. R2 is the room temperature resistance of the above sample soaked in melted tin at 230° C. for 3 seconds, and then is placed at the normal atmosphere temperature for 1 hour. The comparison reveals that the products of the present invention truly possess better adhesion and a lower interfacial resistance.

Moreover, the metal laminated material of the present invention can be a ready-made single-sided printed circuit board or a double-sided foil substrate, and thus the process of manufacturing the thermistor can easily to imitate the currently well-developed process of the printed circuit board. Manufacturing the thermistor by means of the plaque fabrication method of the printed circuit board process is simpler than currently used continuous electroplating process for the whole roll of soft foil, and thus the process can be greatly simplified accordingly.

The technical contents and features of the present invention are disclosed above. However, anyone that is familiar with the technique could possibly make modify or change the details in accordance with the present invention without departing from the technologic ideas and spirit of the invention. For example, changing the ingredients in the electroplated solution such as employing Watts Nickel, adding different kinds of carbon black, or changing composite electroplating conditions such as electroplated temperature, electroplated current, and electroplated time are within the protection scope of the present invention. The protection scope of the present invention shall not be limited to what embodiment discloses, it should include various modification and changes that are made without departing from the technologic ideas and spirit of the present invention, and should be covered by the claims mentioned below.

What is claimed is:

1. A method for preparing composite materials of a positive temperature coefficient thermistor device, comprising the following steps:

providing a metal laminated material comprising a top metal layer and a bottom metal layer, an insulating layer between the top and the bottom metal layer, and a conducting through hole disposed between the top metal layer and the bottom metal layer;

performing a composite electroplating process using an electroplating solution comprising boric acid, carbon black and nickel to form a composite electroplating layer on the surface of the top metal layer, wherein the composite electroplating layer is a continuous porous structure with a secondary aggregation of carbon black and electroplated metal; and thermal-laminating a polymeric composite material on the composite electroplating layer to form the composite materials of the positive temperature coefficient thermistor device, wherein the polymeric composite material is conductive crystallized and filled with carbon black.

2. The method according to claim 1, wherein the polymeric composite material is selected from the group consisting of polyethylene, polypropylene, polyvinyl fluoride and copolymers thereof.

3. The method according to claim 1, wherein the thickness of the composite electroplating layer with a continuous porous structure is more than 0.2 µm.

4. The method according to claim 1, wherein the insulating layer is made of the material selected from the group consisting of epoxy resin, polyimide resin, a glass fiber cloth impregnated with epoxy resin, and a glass fiber cloth impregnated with polyimide.

5. The method according to claim 1, further comprising a chemical cleaning process performed before the composite electroplating process.

6. The method according to the claim 5, further comprising a cathode degreasing process performed before the chemical cleaning process.

7. The method according to the claim 1, wherein the composite electroplating process is performed at approximately 35° C.

8. The method according to the claim 1, wherein the composite electroplating process is performed for approximately 10 minutes.

9. The method according to the claim 1, wherein the composite electroplating process is performed by using a current with a current density 3 $A/dm^2$.

* * * * *